United States Patent
Seo et al.

(10) Patent No.: US 8,772,937 B2
(45) Date of Patent: Jul. 8, 2014

(54) SEMICONDUCTOR DEVICE INCLUDING INNER INTERCONNECTION STRUCTURE ABLE TO CONDUCT SIGNALS OR VOLTAGES IN THE SEMICONDUCTOR CHIP WITH VERTICAL CONNECTION VIAS AND HORIZONTAL BURIED CONDUCTIVE LINES

(75) Inventors: Hyun Chul Seo, Seoul (KR); Seung Yeop Lee, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 328 days.

(21) Appl. No.: 13/162,775

(22) Filed: Jun. 17, 2011

(65) Prior Publication Data

US 2012/0126373 A1    May 24, 2012

(30) Foreign Application Priority Data

Nov. 18, 2010   (KR) .......................... 10-2010-0115038

(51) Int. Cl.
    *H01L 23/48*    (2006.01)
(52) U.S. Cl.
    USPC ............. 257/758; 257/E21.585; 257/E21.577
(58) Field of Classification Search
    USPC ........... 257/758, E21.577, E23.145, E23.167, 257/774

IPC .......... H01L 23/481,23/535, 25/105, 23/53295, H01L 21/76807, 23/5329, 21/76831, 23/5226, H01L 21/02063

See application file for complete search history.

(56) References Cited

U.S. PATENT DOCUMENTS

2012/0056315 A1*   3/2012   Chang et al. .................. 257/737

FOREIGN PATENT DOCUMENTS

| JP | 2002-261232 A | 9/2002 |
|----|---------------|--------|
| KR | 1020100030496 A | 3/2010 |

\* cited by examiner

*Primary Examiner* — Eva Y Montalvo
(74) *Attorney, Agent, or Firm* — William Park & Associates Patent Ltd.

(57) ABSTRACT

A semiconductor device includes a semiconductor chip and an inner interconnection structure. The semiconductor chip includes a front surface that exposes first connection terminals and a rear surface that is opposite to the front surface and exposes second connection terminals separated from the first connection terminals. The inner interconnection structure includes horizontal buried conductive lines and vertical connection lines disposed to pierce the semiconductor chip to connect the first connection terminals and the second connection terminals.

17 Claims, 7 Drawing Sheets

SEMICONDUCTOR DEVICE INCLUDING INNER INTERCONNECTION STRUCTURE ABLE TO CONDUCT SIGNALS OR VOLTAGES IN THE SEMICONDUCTOR CHIP WITH VERTICAL CONNECTION VIAS AND HORIZONTAL BURIED CONDUCTIVE LINES

CROSS-REFERENCES TO RELATED APPLICATIONS

The present application claims priority under 35 U.S.C. 119(a) to Korean Application No. 10-2010-0115038, filed on Nov. 18, 2010, in the Korean intellectual property Office, which is incorporated herein by reference in its entirety.

BACKGROUND

Exemplary embodiments of the present invention relate to semiconductor technologies, and more particularly, to a semiconductor device including an inner interconnection structure.

A semiconductor device package requires semiconductor chips to be mounted at a high density in a small area. Therefore, what is being developed is a technology for forming a three-dimensional stack package by contacting semiconductor chips using a through silicon via (TSV) structure. Because the TSV is formed to pierce a semiconductor chip, the TSV structure can reduce an electrical signal transmission path more effectively than a wire bonding structure. Thus, the TSV structure is expected to be advantageous to high-speed operation devices.

Because the TSV is introduced to pierce the semiconductor chip, the TSV is located in a restricted region on the surface of the semiconductor chip. Although the TSV cannot be disposed in an active region of the semiconductor chip in which circuit elements are integrated, the TSV may be located in an edge region of the semiconductor chip or in a center region of the semiconductor chip in which a scribe lane region is located. Thus, the exposure location of a TSV exposed as a connection terminal on the rear surface of the semiconductor chip is restricted within the restricted region.

Solder balls may be used when mounting a semiconductor chip on a module substrate or another electronic device as external connection terminals for the electrical connection between the semiconductor chip and the module substrate or another electronic device. However, the arrangement of solder balls is restricted by the JEDEC (Joint Electron Device Engineering Council) standards, and the location of the solder ball may be inconsistent with the location of a TSV. Thus, in order to electrically connect the solder ball and the TSV, a printed circuit board (PCB) or a rearrangement interconnection for interconnection routing is disposed between the solder ball and the semiconductor chip. Thus, the location of the TSV may be restricted by the arrangement of solder balls, and the electrical signal path may be increased by the introduction of a separate substrate.

SUMMARY

An embodiment of the present invention relates to a semiconductor device that can overcome the restriction due to the arrangement of external connection terminals, thus allowing more latitude in placing a TSV or a connection pad.

In one embodiment, a semiconductor device includes: a semiconductor chip including a front surface with circuit elements and interconnections integrated thereon and a rear surface opposite to the front surface; buried conductive lines comprising a first buried conductive line and a second buried conductive line, wherein the first buried conductive line is vertically separated from a second buried conductive line with respect to the front surface of the semiconductor chip; a first conductive via connected to the buried conductive line by piercing from the front surface of the semiconductor chip; and a second conductive via connected to the buried conductive line by piercing from the rear surface of the semiconductor chip.

In another embodiment, a semiconductor device includes: a semiconductor chip including a front surface and a rear surface opposite to the front surface; buried conductive lines comprising a first buried conductive line and a second buried conductive line, wherein the first buried conductive line is vertically separated from a second buried conductive line with respect to the front surface of the semiconductor chip; a first conductive via connected to the first buried conductive line by piercing from the front surface of the semiconductor chip; a second conductive via connected to the second buried conductive line by piercing from the rear surface of the semiconductor chip; and a third conductive via disposed to connect the first buried conductive line and the second buried conductive line.

In another embodiment, a semiconductor device includes: a semiconductor chip including a front surface that exposes first connection terminals and a rear surface that is opposite to the front surface and exposes second connection terminals separated from the first connection terminals; and an inner interconnection structure including horizontal buried conductive lines and vertical connection vias disposed to pierce the semiconductor chip to connect the first connection terminals and the second connection terminals.

The buried conductive lines may include: first buried conductive lines parallel to the front surface of the semiconductor chip and separated from each other to constitute a first array; and second buried conductive lines separated from the first array vertically and arranged across the first array to constitute a second array.

The connection vias may further include a third conductive via disposed to interconnect the first buried conductive line and the second buried conductive line.

The semiconductor device may further include dielectric vias disposed to selectively electrically separate one of the first buried conductive lines and the second buried conductive lines to a plurality of conductive line portions by piercing from one of the front surface and the rear surface of the semiconductor chip.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Exemplary embodiments of the present invention provide a semiconductor device such as a chip-scale package. An inner interconnection structure able to conduct signals or voltages in the semiconductor chip may be provided with vertical connection vias and horizontal buried conductive lines. A dielectric via may be used to electrically separate a buried conductive line to multiple pieces so that each piece may be used for a different electrical path.

Buried conductive lines are arranged on different layers, conductive vias are selectively connected to the buried conductive lines, and dielectric vias selectively electrically separate the buried conductive lines as needed so that the inner interconnection structure can have the degree of two-dimensional or three-dimensional freedom and can connect the first connection terminal and the second connection terminal. Thus, the second connection terminals (e.g., solder balls) whose arrangement is restricted by the JEDEC (Joint Electron Device Engineering Council) standards, and the first connection terminals (e.g., pads) can be connected.

The first connection terminal and the second connection terminal can be connected through the internal path of the chip by the inner interconnection structure even when they do not overlap each other due to a location offset. Therefore, the introduction of a printed circuit board (PCB) or a rearrangement interconnection for interconnection routing is unnecessary. Also, because the first connection terminal and the second connection terminal are directly interconnected by the inner interconnection structure, the electrical connection path can be reduced. Subsequently, the semiconductor device can implement higher-speed operations.

Figure 1:
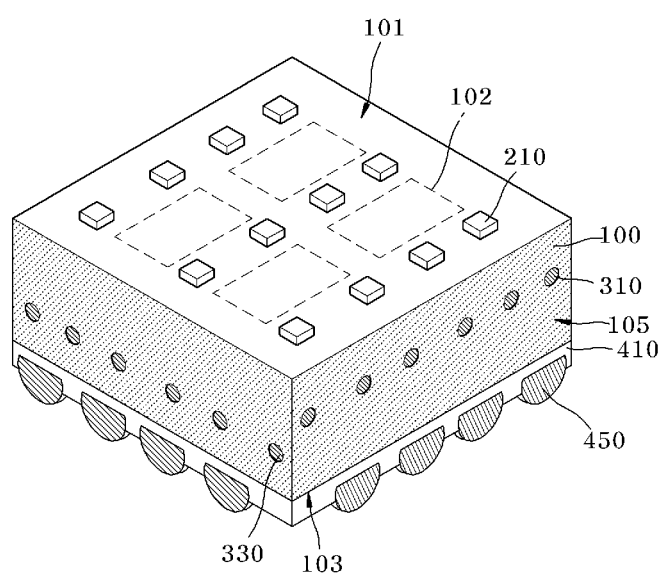
FIG. 1 is a perspective view illustrating an example of a semiconductor device according to an exemplary embodiment of the present invention.
Figure 2:
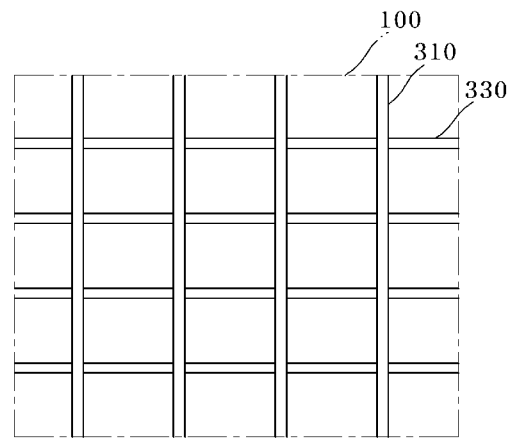
FIG. 2 is a plan view illustrating the arrangement of buried conductive lines according to an exemplary embodiment of the present invention.
Figure 3:
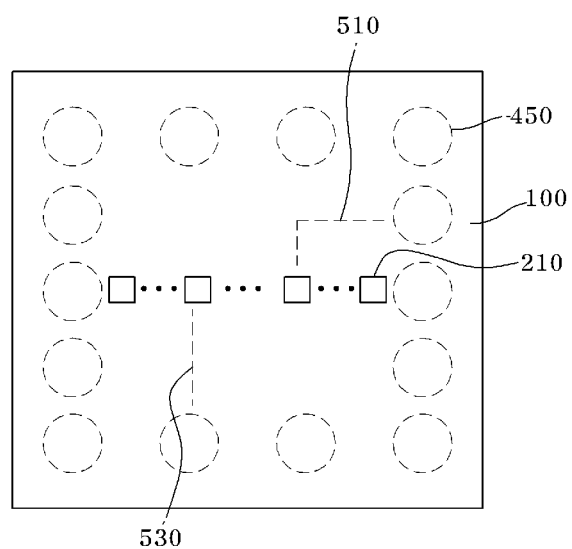
FIG. 3 is a plan view illustrating an inner interconnection structure according to an exemplary embodiment of the present invention.
Figure 4:
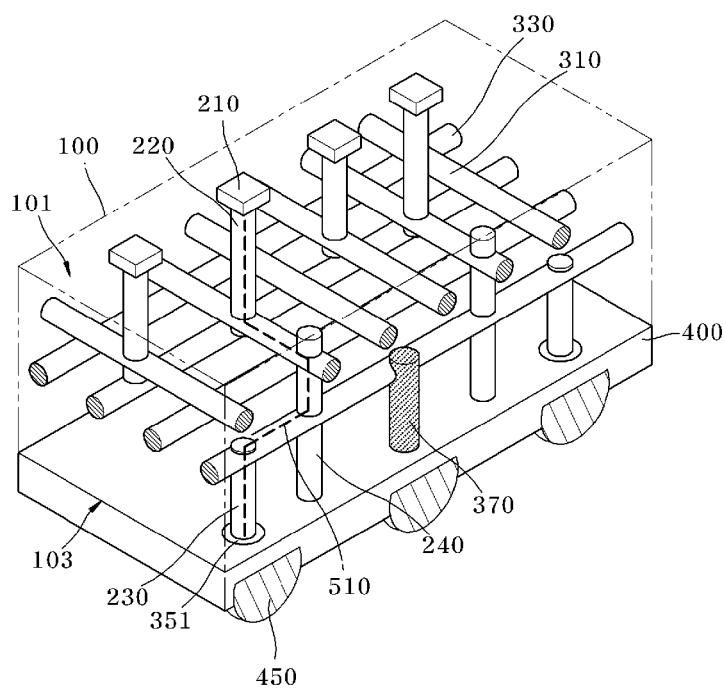
FIGS. 4 and 5 are views illustrating an example of an inner interconnection structure according to an exemplary embodiment of the present invention.
Figure 5:
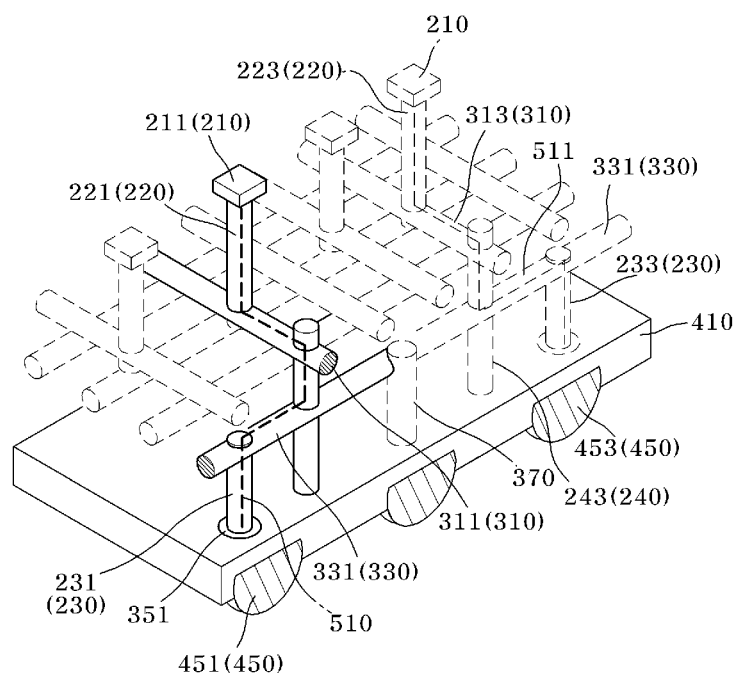
Figure 6:
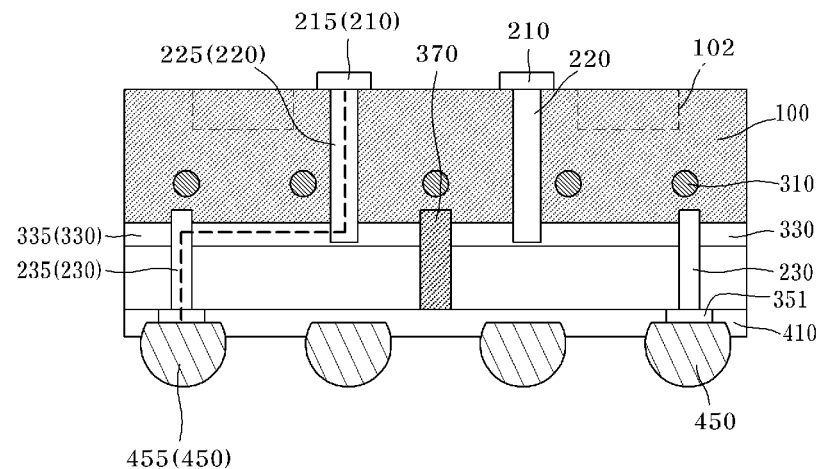
FIG. 6 is a cross-sectional view illustrating another example of an inner interconnection structure according to an exemplary embodiment of the present invention.
Figure 7:
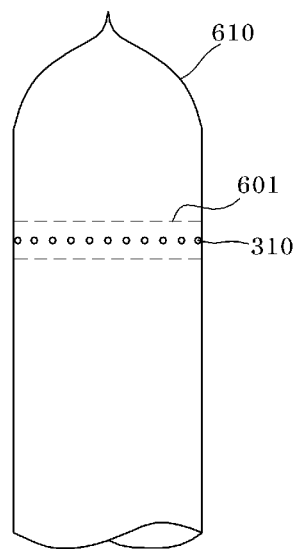
FIG. 7 is a view illustrating a process of forming a buried conductive line according to an exemplary embodiment of the present invention.
Figure 8:
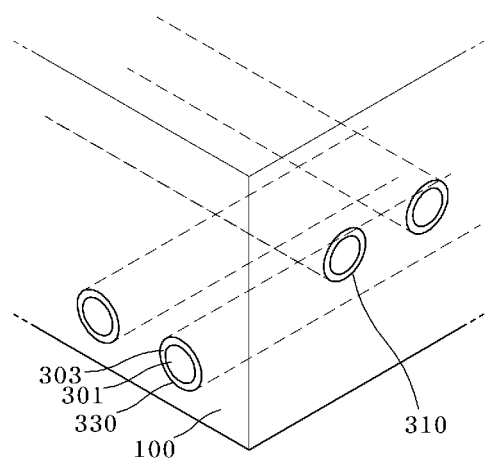
FIG. 8 is a view illustrating a sectional structure of a buried conductive line according to an exemplary embodiment of the present invention.
Figure 9:
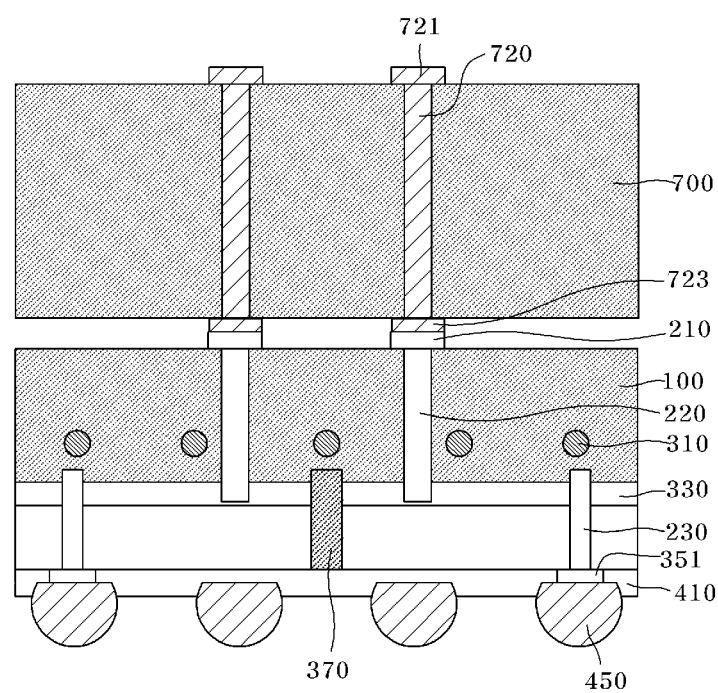
FIG. 9 is a cross-sectional view illustrating a modification of a semiconductor device according to an exemplary embodiment of the present invention.

FIG. 1 is a perspective view illustrating an example of a semiconductor device according to an exemplary embodiment of the present invention. FIG. 2 is a plan view illustrating the arrangement of buried conductive lines according to an exemplary embodiment of the present invention. FIG. 3 is a plan view illustrating an inner interconnection structure according to an exemplary embodiment of the present invention. FIGS. 4 and 5 are views illustrating an example of an inner interconnection structure according to an exemplary embodiment of the present invention. FIG. 6 is a cross-sectional view illustrating another example of an inner interconnection structure according to an exemplary embodiment of the present invention. FIG. 7 is a view illustrating a process of forming a buried conductive line according to an exemplary embodiment of the present invention. FIG. 8 is a view illustrating a sectional structure of a buried conductive line according to an exemplary embodiment of the present invention. FIG. 9 is a cross-sectional view illustrating a modification of a semiconductor device according to an exemplary embodiment of the present invention.

Referring to FIG. 1, circuitry, such as, for example, memory banks for DRAM devices are disposed in active regions 102 of a front surface 101 of a semiconductor chip 100. Elements such as transistors may be integrated in the active regions 102. In the case of a DRAM device, a cell transistor and a capacitor (not shown) are integrated to constitute a memory cell in each active region 102, and circuit elements and interconnections for operating and sensing the memory cells are also integrated therein. First connection terminals 210 (e.g., a connection pad) may be disposed in a region other than the active region 102. Thus, the first connection terminal 210 may be disposed as a center pad in a center region of the semiconductor chip 100, or may be disposed as an edge pad in an edge region of the semiconductor chip 100.

Second connection terminals 450, which may be, for example, solder balls, may be disposed on a rear surface 103 of the semiconductor chip 100. The arrangement of solder balls is restricted by the JEDEC (Joint Electron Device Engineering Council) standards. In order to prevent an electrical short between the second connection terminals 450, a solder resist 410 may be introduced to open the locations of the solder balls on the rear surface 103. Furthermore, an insulating material, such as for example, a dielectric material, may be disposed on the rear face 103 to electrically isolate the second connection terminals 450.

First buried conductive lines 310 may be separated vertically from second buried conductive lines 330. The first buried conductive lines 310 may and the second buried conductive lines 330 may pierce side surfaces 105 of the semiconductor chip 100. As illustrated in FIG. 2, each of the first buried conductive lines 310 are separated from each other, and each of the second buried conductive lines 330 are separated from each other. The first buried conductive lines 310 and the second buried conductive lines 330 may be disposed to perpendicularly intersect each other in plane view, and may be disposed to form a two-dimensional mesh when viewed from above.

Referring to FIGS. 1 and 3, the location of the first connection terminal 210 on the front surface 101 of the semiconductor chip 100 may be restricted by the active region 102. For example, as illustrated in FIG. 3, one of the first connection terminals 210, such as a first connection terminal 211, disposed as a center pad, and one of the second connection terminals 450, such as a second connection terminal 451, disposed on the rear surface 103 of the semiconductor chip 100 may be offset laterally when viewed from above. Thus, the first connection terminal 211 and the second connection terminal 451 cannot be directly connected by the TSV (Through Silicon Via) that vertically pierces the semiconductor chip 100.

In order to connect the first connection terminal 211 and the second connection terminal 451, the semiconductor chip 100 may be formed to include a first path 510. In an exemplary embodiment of the present invention, one of the first buried conductive lines 310 and one of the second buried conductive lines 330 may be connected by, for example, a via to construct the first path 510. Accordingly, it can be seen that the buried conductive lines 310 and 330 and vias may be used to connect various first connection terminals 210 at the front surface 101 of the chip 100 to various second connection terminals 450 at the rear surface 103 of the chip 100.

Referring to FIGS. 4 and 5, considering an example of the inner interconnection structure of the semiconductor device according to an exemplary embodiment of the present invention, the first buried conductive lines 310 and the second buried conductive lines 330 are introduced in the semiconductor chip 100. Connection vias 220, 230 and 240 connect appropriate buried conductive lines 310 and 330 to electrically connect one of the first connection terminals 210, referred to as the first connection terminal 211, exposed at the front surface 101 of the semiconductor chip 100 to one of the second connection terminals 450, referred to as the second connection terminal 451, exposed at the rear surface 103 of the semiconductor chip 100.

One of first conductive vias 220, referred to as via 221, may pierce from the front surface 101 of the semiconductor chip 100 to connect to one of the first buried conductive lines 310. One of second conductive vias 230, referred to as via 231, may connect to one of the second buried conductive lines 330. One of third conductive vias 240, referred to as via 241, may connect one of the first buried conductive lines 310 and one of the second buried conductive lines 330. Accordingly, the first path 510 may be selectively formed to connect the first connection terminal 211 to the second connection terminal 451. The conductive vias 220, 230 and 240 may be formed, for example, as TSVs.

As illustrated in FIG. 5, for the inner interconnection structure constructing the first path 510 connecting the first connection terminal 211 and the corresponding second connection terminal 451, the via 221 connected to the first connection terminal 211 is introduced to be connected to one of the first buried conductive lines 310, referred to as a first buried conductive line 311, and the via 241 is selectively introduced to connect the first buried conductive line 311 to one of the second buried conductive lines 330, referred to as a second buried conductive line 331. The via 231 is formed to connect the second buried conductive line 331 and the second connection terminal 451. Accordingly, the first path 510 connecting the first connection terminal 211 and the second connection terminal 451 is provided in the semiconductor chip 100.

The second buried conductive line 331 may also be used, for example, to connect another first connection terminal 213 to another second connection terminal 453. This may be done, for example, by forming a path 511 between the first connection terminal 213 and the second connection terminal 453. The path 511 may be formed by connecting the first connection terminal 213 to a first buried conductive line 313 using a via 223, connecting the first buried conductive line 313 to the second buried conductive line 331 using a via 243, and connecting the second buried conductive line 331 to the second connection terminal 453 using a via 233.

Because the second connection terminal 453 and the selected second connection terminal 451 may not be desired to be shorted, a dielectric via 370 is introduced to isolate a portion of the second buried conductive line 331 connected to the second connection terminal 451 from a portion of the second buried conductive line 331 connected to the second connection terminal 453 by piercing the second buried conductive line 331. The dielectric via 370 may also be formed through a TSV process. Unlike the conductive vias 220, 230 and 240, the dielectric via 370 is formed by filling the through hole with a dielectric material, not a conductive material.

Referring to FIGS. 4 and 5, it can be seen that dielectric vias, such as the dielectric via 370, may be introduced to separate any of the first buried conductive lines 310 and the second buried conductive lines 330 as needed into two or more portions. The dielectric via may be provided in the shape of a TSV piercing from the rear surface 103 of the semiconductor chip 100, and may be provided in the shape of a TSV piercing from the front surface 101 of the semiconductor chip. Although not shown, there may be more than 2 layers of conductive lines. In such cases, the dielectric via may be formed without piercing the front surface 101 or the rear surface 103 during formation of the chip 100.

The second path 530 of FIG. 3 may be formed to have a two-dimensional inner interconnection structure as illustrated in FIG. 6. For the inner interconnection structure of the second path 530 connecting a first connection terminal 215 and a corresponding second connection terminal 455, a via 225 connected to the first connection terminal 215 is connected to a second buried conductive line 335, and a via 235 is connected to the second buried conductive line 335 and a second connection terminal 455. Accordingly, the second path 530 connecting the first connection terminal 215 and the second connection terminal 455 is provided in the semiconductor chip 100 including a two-dimensional path. Herein, the dielectric via 370 is selectively introduced to electrically separate the second buried conductive line 335 by piercing the second buried conductive line 335. Accordingly, a portion of the second buried conductive line 335 may be used for another path connecting another first connection terminal 210 to another second connection terminal 450. Although it is illustrated that the second path 530 is formed by using only the second buried conductive line 330, the second path 530 may also be similarly formed by using only the first buried conductive line 310.

Referring to FIGS. 1 and 6, because the second buried conductive lines 335 and 330 or the first buried conductive lines 310 is buried in the semiconductor chip 100 or a semiconductor substrate, they are underneath the active region 102 where circuit elements including transistors, capacitors or interconnections are integrated through a semiconductor integration process on the front surface 101 of the semiconductor chip 100. Accordingly, the buried conductive lines 310 and 330 do not interfere with the normal operation of the elements in the active region 102.

Referring to FIG. 7, the buried conductive lines 310 and 330 according to an exemplary embodiment of the present invention may be formed to pierce the semiconductor chip laterally. To this end, before forming the conductive vias 220, 230 and 240, the buried conductive lines 310 and 330 may be formed through a TSV process or a drilling process to pierce a wafer-level semiconductor substrate laterally. Also, as illustrated in FIG. 7, before slicing from an ingot 610 into a wafer 601 or a semiconductor substrate, the buried conductive line 310 may be formed to pierce laterally.

Referring to FIG. 8, for the buried conductive lines 310 and 330 a through hole may be formed to pierce the semiconductor chip 100 laterally, a conductive core part 301 is formed of a conductive material (e.g., copper or conductive silicon) at the center of the through hole, and an insulating material, such as a dielectric layer 330, is formed to cover the conductive core part 301, thus isolating the conductive core part 301 from the semiconductor chip 100.

As described above, the semiconductor device has an inner interconnection structure to more freely connect the first connection terminal (210 of FIG. 4) and the second connection terminal (450 of FIG. 4), thus increasing the degree of freedom of the location of the first connection terminal 210. The semiconductor device forms a chip-scale package. However, as illustrated in FIG. 9, a second semiconductor chip 700, which has a third connection terminal 721 and a fourth connection terminal 723 in a pad shape and a TSV 720 connecting the third connection terminal 721 and a fourth connection terminal 723, may be stacked on the semiconductor chip 100 to form a stack package. For example, the first semiconductor chip 100 may be a chip of a DRAM device with a center pad array, and the second semiconductor chip 700 may be a CPU, GPU or LSI chip. The inner interconnection structure of the semiconductor device described above may be used to interconnect different pad locations when stacking, for example, a NAND memory chip with an edge pad array in an edge region of the chip and a DRAM chip with a center pad array.

According to the present invention, vertical connection vias and horizontal buried conductive lines may provide the inner interconnection structure for applying signals or voltages in the semiconductor chip. Thus, the pads that are connection terminals on the front surface of the semiconductor chip can be disposed regardless of the arrangement of the solder balls that are external connection terminals whose arrangement is restricted by the JEDEC (Joint Electron Device Engineering Council) standards. Accordingly, the degree of freedom of the pad arrangement on the front surface of the semiconductor chip can be increased.

The inner interconnection structure can connect the pad on the front surface of the semiconductor chip to the solder ball on the rear surface of the semiconductor chip. Accordingly, the introduction of a printed circuit board (PCB) or a rearrangement interconnection for interconnection routing is unnecessary. Also, because the pad and the solder ball are directly interconnected by the inner interconnection structure, the electrical signal path can be reduced. Subsequently, the semiconductor device can implement higher-speed operations.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A semiconductor device comprising:
   a semiconductor chip comprising a front surface with circuit elements and interconnections integrated thereon and a rear surface opposite to the front surface;
   first buried conductive lines vertically separated from the front surface of the semiconductor chip;
   a first conductive via connected to the first buried conductive line by piercing from the front surface of the semiconductor chip;
   a second conductive via connected to the first buried conductive line through the semiconductor chip from the rear surface; and
   a dielectric via disposed to electrically separate one of the buried conductive lines to a plurality of conductive line portions.

2. The semiconductor device of claim 1, wherein the dielectric via is disposed to electrically separate one of the buried conductive lines by piercing from one of the front surface and the rear surface of the semiconductor chip.

3. The semiconductor device of claim 1, wherein the buried conductive lines are parallel to the front surface of the semiconductor chip.

4. The semiconductor device of claim 1, the buried conductive lines further comprising a second buried conductive line, wherein the first buried conductive line is perpendicular to the second buried conductive line.

5. The semiconductor device of claim 1, wherein the buried conductive line comprises a conductive core part covered by an insulating layer.

6. The semiconductor device of claim 1, wherein the buried conductive line pierces the semiconductor chip laterally.

7. The semiconductor device of claim 1, wherein the first conductive via and the second conductive via are connected to the first buried conductive line at locations offset from each other.

8. The semiconductor device of claim 1, further comprising:
   a first connection terminal connected to a part of the first conductive via exposed at the front surface of the semiconductor chip; and
   a second connection terminal connected to a part of the second conductive via exposed at the rear surface of the semiconductor chip.

9. The semiconductor device of claim 8, wherein the first connection terminal comprises a pad connected to a through via of a second semiconductor chip stacked on the semiconductor chip.

10. The semiconductor device of claim 8, further comprising a dielectric layer disposed to cover the rear surface of the semiconductor chip wherein the second connection terminal is exposed.

11. The semiconductor device of claim 10, wherein the second connection terminal comprises a ball land.

12. A semiconductor device comprising:
    a semiconductor chip comprising a front surface and a rear surface opposite to the front surface;
    buried conductive lines comprising a first buried conductive line and a second buried conductive line, wherein the first buried conductive line is vertically separated from a second buried conductive line with respect to the front surface of the semiconductor chip;
    a first conductive via connected to the first buried conductive line by piercing from the front surface of the semiconductor chip;
    a second conductive via connected to the second buried conductive line through the semiconductor chip from the rear surface;
    a third conductive via disposed to connect the first buried conductive line and the second buried conductive line; and
    a dielectric via disposed to separate one of the buried conductive lines to a plurality of conductive line portions.

13. The semiconductor device of claim 12, wherein the first conductive via, the second conductive via, and the third conductive via are separated from each other.

14. The semiconductor device of claim 12, further comprising:
    a first connection terminal connected to a part of the first conductive via exposed at the front surface of the semiconductor chip; and
    a second connection terminal connected to a part of the second conductive via exposed at the rear surface of the semiconductor chip.

15. A semiconductor device comprising:
    a semiconductor chip comprising a front surface that exposes first connection terminals and a rear surface that is opposite to the front surface and exposes second connection terminals separated from the first connection terminals; an inner interconnection structure comprising horizontal buried conductive lines and connection vias disposed to pierce the semiconductor chip to connect the first connection terminals and the second connection terminals; and
    a dielectric via disposed to electrically separate one of the buried conductive lines to a plurality of conductive line portions.

16. The semiconductor device of claim 15, wherein the connection vias comprise:
- a first conductive via connected to one of the buried conductive lines by piercing from the front surface of the semiconductor chip; and
- a second conductive via connected to one of the buried conductive lines by piercing from the rear surface of the semiconductor chip.

17. The semiconductor device of claim 16, wherein
- the buried conductive lines comprise first buried conductive lines parallel to the front surface of the semiconductor chip and separated from each other to constitute a first array; and second buried conductive lines separated from the first array vertically and arranged across the first array to constitute a second array,
- the connection vias further comprise a third conductive via disposed to interconnect the first buried conductive line and the second buried conductive line, and the semiconductor device further comprises a dielectric via disposed to selectively electrically separate one of the first buried conductive lines and the second buried conductive lines to a plurality of conductive line portions by piercing from one of the front surface and the rear surface of the semiconductor chip.

* * * * *